United States Patent
Seo et al.

(10) Patent No.: US 9,837,482 B2
(45) Date of Patent: Dec. 5, 2017

(54) DISPLAY DEVICE

(71) Applicant: Samsung Display Co., Ltd., Yongin-si, Gyeonggi-do (KR)

(72) Inventors: Tae An Seo, Hwaseong-si (KR); Bo Ik Park, Uiwang-si (KR); Jin Hwan Choi, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/178,343

(22) Filed: Jun. 9, 2016

(65) Prior Publication Data
US 2017/0117345 A1    Apr. 27, 2017

(30) Foreign Application Priority Data
Oct. 27, 2015 (KR) .................. 10-2015-0149637

(51) Int. Cl.
*H01L 27/12* (2006.01)
*H01L 27/32* (2006.01)
*H01L 51/00* (2006.01)

(52) U.S. Cl.
CPC ...... *H01L 27/3276* (2013.01); *H01L 51/0097* (2013.01); *H01L 27/3246* (2013.01); *H01L 2251/5338* (2013.01)

(58) Field of Classification Search
CPC . H01L 27/32; H01L 27/3276; H01L 51/0097; H01L 2251/5338
See application file for complete search history.

(56) References Cited

U.S. PATENT DOCUMENTS

| | | | | |
|---|---|---|---|---|
| 2007/0228389 A1* | 10/2007 | Hsu | ........................ | H01L 27/124 257/79 |
| 2008/0055532 A1* | 3/2008 | Wu | ..................... | G02F 1/13394 349/156 |
| 2008/0296581 A1* | 12/2008 | Chao | .................. | G02F 1/136213 257/71 |
| 2009/0310070 A1* | 12/2009 | Ishii | .................. | G02F 1/133555 349/114 |
| 2012/0273034 A1* | 11/2012 | Sato | .................... | H01L 31/0392 136/252 |
| 2014/0003022 A1* | 1/2014 | Lee | .......................... | H05K 7/02 361/809 |
| 2014/0183502 A1* | 7/2014 | Song | ................... | H01L 27/3246 257/40 |
| 2014/0204303 A1* | 7/2014 | Koide | ............... | G02F 1/136286 349/43 |
| 2015/0034932 A1* | 2/2015 | Choi | ................... | H01L 27/3258 257/40 |

FOREIGN PATENT DOCUMENTS

| | | |
|---|---|---|
| JP | 2003-149665 A | 5/2003 |
| KR | 10-0762686 B1 | 9/2007 |
| KR | 10-2014-0099164 A | 8/2014 |
| KR | 10-2015-0037159 A | 4/2015 |

* cited by examiner

*Primary Examiner* — Phuc Dang
(74) *Attorney, Agent, or Firm* — Knobbe Martens Olson & Bear LLP

(57) ABSTRACT

A display device is disclosed. In one aspect, the display device includes a substrate and a plurality of scan lines formed over the substrate and separated from each other in a first direction. The scan lines extend in a second direction crossing the first direction. The display device also includes a stress compensation layer positioned between adjacent ones of the scan lines.

19 Claims, 8 Drawing Sheets

DISPLAY DEVICE

RELATED APPLICATION

This application claims priority to and the benefit of Korean Patent Application No. 10-2015-0149637 filed in the Korean Intellectual Property Office on Oct. 27, 2015, the entire contents of which are incorporated herein by reference.

BACKGROUND

Field

The described technology generally relates to a display device.

Description of the Related Technology

Example types of display devices include organic light-emitting diode (OLED) displays, liquid crystal displays (LCDs), and plasma display panels (PDPs).

Among them, an OLED display includes a substrate, wires positioned on the substrate, and OLEDs connected to the wires.

Recently, flexible OLED displays have been developed.

SUMMARY OF CERTAIN INVENTIVE ASPECTS

One inventive aspect relates to a display device that is suppressed from being damaged by stress generated in the substrate as the substrate is bent.

Another aspect is a display device including a substrate; a plurality of scan lines respectively separated in a first direction on the substrate and extending in a second direction; and a stress compensation layer positioned between adjacent scan lines among the plurality of scan lines.

The stress compensation layer can float on the substrate.

The stress compensation layer can overlap at least one of the adjacent scan lines.

The stress compensation layer may not overlap adjacent scan lines.

The stress compensation layer can be positioned between the substrate and one of the adjacent scan lines.

The stress compensation layer can be positioned on the adjacent scan lines.

The stress compensation layer can be positioned with the same layer as the adjacent scan lines.

The stress compensation layer can include: a first sublayer positioned on the substrate; and a second sublayer positioned on the first sublayer.

A plurality of transistors connected to at least one among the plurality of scan lines, and a plurality of organic light emitting elements connected to the plurality of transistors, can be further included.

The transistor can include: an active layer positioned on the substrate; and a gate electrode positioned on the active layer.

The stress compensation layer can be positioned with the same layer as the active layer.

The stress compensation layer can be positioned with the same layer as the gate electrode.

A plurality of data lines crossing the plurality of scan lines and connected to at least one among the plurality of transistors can be further included.

The stress compensation layer can cross the plurality of data lines.

The stress compensation layer can extend in a direction parallel to the second direction.

The stress compensation layer can have a line shape.

The stress compensation layer can have an island shape.

The substrate can be flexible.

An insulating layer covering the stress compensation layer can be further included, and the stress compensation layer can include a different material from that of the insulating layer.

The stress compensation layer can have a larger Young's modulus than the insulating layer.

Another aspect is a display device comprising: a substrate; a plurality of scan lines formed over the substrate and separated from each other in a first direction, wherein the scan lines extend in a second direction crossing the first direction; and a stress compensation layer positioned between adjacent ones of the scan lines.

In the above display device, the stress compensation layer is configured to electrically float.

In the above display device, the stress compensation layer overlaps at least one of the adjacent scan lines in the depth dimension of the display device.

In the above display device, the stress compensation layer does not overlap the adjacent scan lines in the depth dimension of the display device.

In the above display device, the stress compensation layer is positioned between the substrate and one of the adjacent scan lines.

In the above display device, the stress compensation layer is positioned on the adjacent scan lines.

In the above display device, the stress compensation layer is positioned on the same layer as the adjacent scan lines.

In the above display device, the stress compensation layer includes: a first sublayer positioned over the substrate; and a second sublayer positioned over the first sublayer.

The above display device further comprises: a plurality of transistors electrically connected to at least one of the scan lines; and a plurality of organic light-emitting diodes (OLEDs) electrically connected to the transistors.

In the above display device, each of the transistors includes: an active layer positioned over the substrate; and a gate electrode positioned over the active layer.

In the above display device, the stress compensation layer is positioned on the same layer as the active layer.

In the above display device, the stress compensation layer is positioned on the same layer as the gate electrode.

The above display device further comprises a plurality of data lines crossing the scan lines and electrically connected to at least one of the transistors.

In the above display device, the stress compensation layer crosses the data lines.

In the above display device, the stress compensation layer extends in the second direction.

In the above display device, the stress compensation layer has a line shape.

In the above display device, the stress compensation layer has an island shape.

In the above display device, the substrate is flexible.

The above display device further comprises an insulating layer covering the stress compensation layer, wherein the stress compensation layer is formed of a different material from the insulating layer.

In the above display device, the stress compensation layer has a Young's modulus greater than that of the insulating layer.

According to at least one of the disclosed embodiments, as the substrate is bent, the display device can be prevented from being damaged by the stress generated on the substrate.

DETAILED DESCRIPTION OF CERTAIN INVENTIVE EMBODIMENTS

Figure 1:
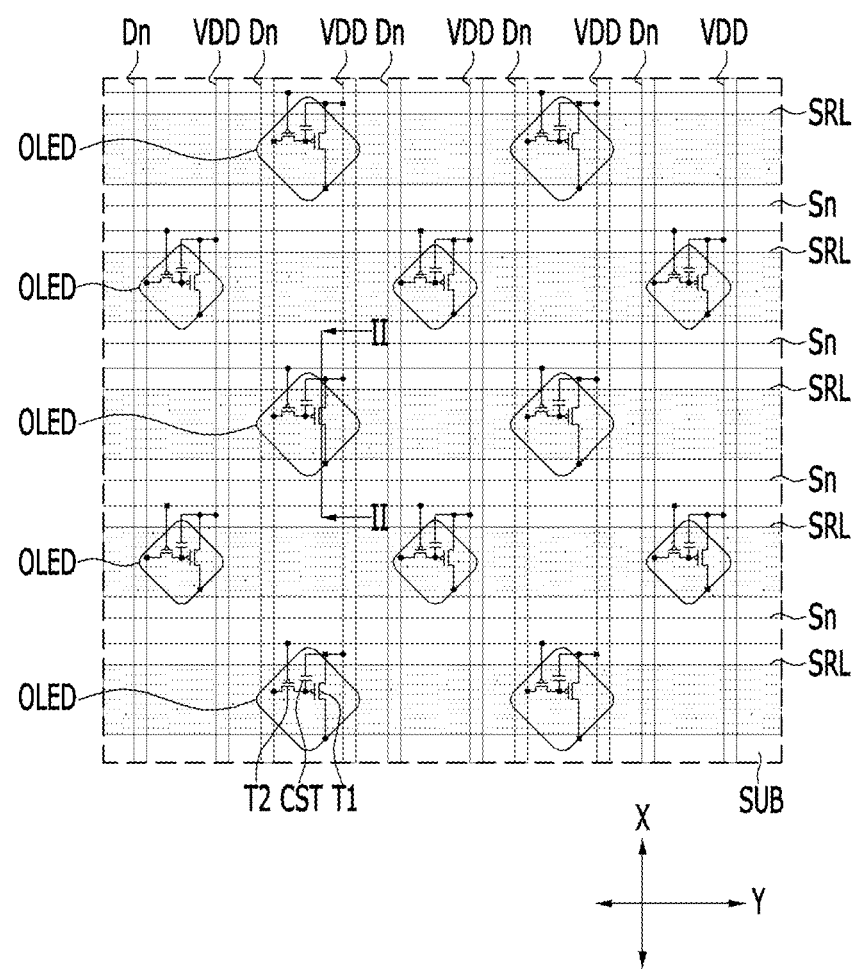
FIG. 1 is a top plan view of a part of a display device according to an exemplary embodiment.

Hereinafter, the described technology will be described more fully with reference to the accompanying drawings, in which exemplary embodiments of the invention are shown. As those skilled in the art would realize, the described embodiments can be modified in various different ways, all without departing from the spirit or scope of the described technology.

In addition, the size and thickness of each configuration shown in the drawings are arbitrarily shown for better understanding and ease of description, but the described technology is not limited thereto.

In the drawings, the thickness of layers, films, panels, regions, etc., are exaggerated for clarity. In the drawings, for better understanding and ease of description, the thicknesses of some layers and areas are exaggerated. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Although an OLED display including an OLED will be described as an example of a display device, the described technology covers various display devices such as liquid crystal displays (LCDs), plasma displays (PDs), field emission displays (FEDs), electrophoretic displays, (EPDs), electrowetting displays, (EWDs), and the like, as long as it includes a display member displaying an image and a touch member recognizing a touch.

FIG. 1 is a top plan view of a part of a display device according to an exemplary embodiment.

As shown in FIG. 1, the display device displaying an image includes a substrate SUB, a scan line Sn, a stress compensation layer SRL, a data line Dn, a power source line VDD, a first thin film transistor T1, a second thin film transistor T2, a capacitor CST, and an OLED.

Figure 2:
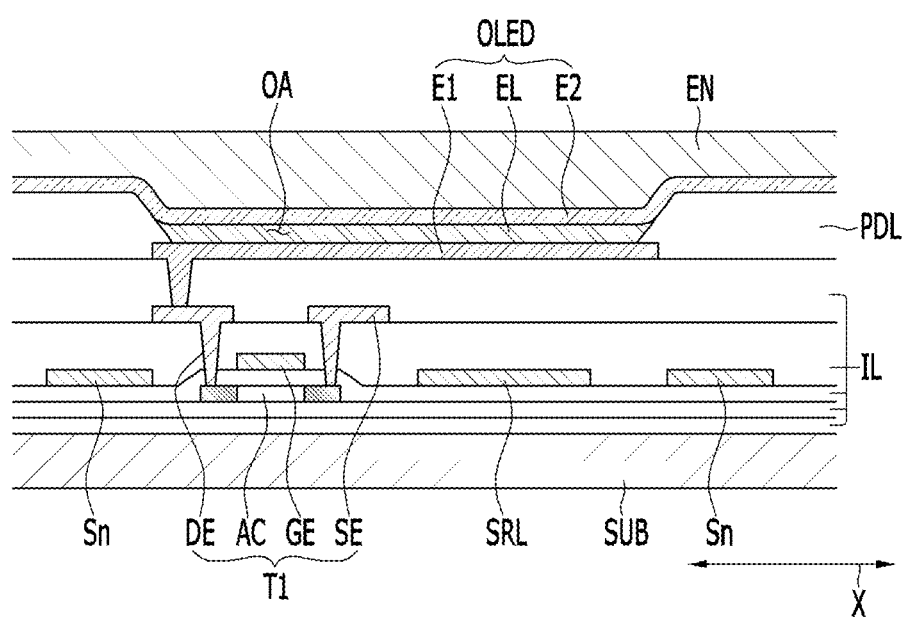
FIG. 2 is a cross-sectional view taken along a line II-II of FIG. 1.

FIG. 2 is a cross-sectional view taken along a line II-II of FIG. 1.

In FIG. 2, for convenience of description, the cross-section of the first thin film transistor is shown, however the position and the cross-section of the first thin film transistor shown in FIG. 2 is not limited to that shown in FIG. 2 and the position of the first thin film transistor can have various positions and cross-sections, respectively. Also, the second thin film transistor in another exemplary embodiment can have various positions and cross-sections, respectively.

As shown in FIG. 2, the display device further includes a plurality of insulating layers IL, pixel definition layer PDL, encapsulation part EN.

As shown in FIG. 1 and FIG. 2, the substrate SUB is formed of at least one among an organic material, an inorganic material, a glass, and a metal. The substrate SUB can be flexible, stretchable, foldable, bendable, or rollable. As the substrate SUB is flexible, stretchable, foldable, bendable, or rollable, the entire display device can be flexible, stretchable, foldable, bendable, or rollable. As the substrate SUB is flexible, being bendable in one direction, as the substrate SUB is bent, the substrate SUB and the display device including the substrate SUB can have a curvature.

The scan line S is positioned on the substrate SUB and can be in plural. A plurality of scan lines Sn are separated in a first direction X on the substrate SUB and extend in a second direction Y. Here, the second direction Y can be a direction crossing the first direction X.

Three insulating layers IL are positioned between the scan line Sn and the substrate SUB, however, between the scan line Sn and the substrate SUB in another exemplary embodiment, one insulating layer, two insulating layers, or at least four insulating layers can be positioned.

One scan line Sn among the scan lines Sn is connected to one OLED through the second thin film transistor T2 and the first thin film transistor T1.

In another exemplary embodiment, the scan lines Sn are connected to one OLED through three or more thin film transistors.

For example, the scan lines are connected to one OLED through three or more thin film transistors and at least one capacitor. The detailed structure of the scan lines, three or more thin film transistors, and at least one capacitor can have various structures.

The stress compensation layer SRL is positioned between scan lines Sn adjacent to each other among the scan lines Sn, and extends in the direction parallel to the second direction Y.

Here, the direction parallel to the second direction Y can be the direction parallel to the second direction Y or the direction substantially parallel to the second direction Y.

The stress compensation layer SRL can be plural. The stress compensation layers SRL are separated in the direction parallel to the first direction X and extend in the direction parallel to the second direction Y. As the stress compensation layers SRL respectively extend in the direction parallel to the second direction Y, the stress compensation layer SRL crosses the data lines Dn.

The stress compensation layer SRL has a line shape and extends in the direction parallel to the second direction Y. However, in another exemplary embodiment, the stress compensation layer SRL extends to be curved at least one time on the plane of the substrate SUB, thereby extending in the direction parallel to the second direction Y with a waved shape. A width, a length, and a height of the stress compensation layer SRL can respectively be various depending on the position thereof, and can have the various widths, lengths, and heights to not generate interference with other configurations neighboring the stress compensation layer SRL.

The stress compensation layer SRL does not overlap the adjacent scan lines Sn and is separated from the scan lines Sn adjacent to each other.

The stress compensation layer SRL floats on the substrate SUB.

Here, the floating of the stress compensation layer SRL can mean a state that the stress compensation layer SRL is not connected to any other configuration and a state that power is not supplied to the stress compensation layer SRL.

The stress compensation layer SRL can be formed of at least one among the organic material, the inorganic material, and the metal.

The stress compensation layer SRL is covered by the insulating layer IL, and the material included in the stress compensation layer SRL can include a material that is different from the material included in the insulating layer IL. The material included in the stress compensation layer SRL can have a greater Young's modulus than the material included in the insulating layer IL. For example, when the insulating layer IL is formed of the inorganic material, the stress compensation layer SRL is formed of the metal having a greater Young's modulus than the inorganic material included in the insulating layer IL.

The stress compensation layer SRL is positioned on the same layer as the scan lines Sn adjacent thereto, and is formed of the same material as the adjacent scan lines Sn. As the stress compensation layer SRL is positioned on the same layer as the scan lines Sn and is formed of the same material as the scan lines Sn, it can be substantially simultaneously formed with the scan lines Sn. As the stress compensation layer SRL is positioned on the same layer as the scan lines Sn, the stress compensation layer SRL is positioned on the same layer as a gate electrode GE of the first thin film transistor T1 positioned on the same layer as the scan lines Sn.

In another exemplary embodiment, the stress compensation layer SRL is positioned on the same layer as the scan lines Sn and is formed of the different material from the scan lines Sn. In this case, the stress compensation layer SRL can be formed by the different process from the process forming the scan lines Sn.

The data line Dn extends in the first direction X crossing the scan lines Sn and the stress compensation layers SRL. The data line Dn is plural, and the data lines Dn are separated from each other in the second direction Y on the substrate SUB and extend in the first direction X. The data line Dn is positioned on the scan line Sn via at least one insulating layer IL.

The power source line VDD extends in the first direction X crossing the scan lines Sn and the stress compensation layers SRL. The power source line VDD is plural, and the power source lines VDD are respectively separated from each other in the second direction Y on the substrate SUB and extend in the first direction X. The power source line VDD is positioned on the scan line Sn via at least one insulating layer IL, and is separated from the data line Dn on the substrate SUB.

The first thin film transistor T1, the second thin film transistor T2, and the capacitor CST can configure one pixel circuit connected to one OLED.

In another exemplary embodiment, one pixel circuit includes three or more thin film transistors and at least one capacitor.

The first thin film transistor T1 includes the gate electrode GE, an active layer AC, a source electrode SE, and a drain electrode DE.

The gate electrode GE of the first thin film transistor T1 is connected to the capacitor CST and the drain electrode of the second thin film transistor. The gate electrode GE is positioned on the same layer as the scan line Sn.

The active layer AC is positioned between the substrate SUB and the gate electrode GE, and includes a source region, a channel region, and a drain region. The source region of the active layer AC is connected to the source electrode SE, the channel region is positioned between the source region and the drain region, and the drain region is connected to the drain electrode DE.

The source electrode SE is connected to the power source line VDD, and the drain electrode DE is connected to the first electrode E1 of the OLED.

The second thin film transistor T2 includes a gate electrode connected to the scan line Sn, a source electrode connected to the data line Dn, a drain electrode connected to the capacitor CST, and an active layer connecting between the source electrode and the drain electrode. The detailed shape of the second thin film transistor T2 can have various shapes.

The capacitor CST includes one electrode connected to the power source line VDD, and the other electrode respectively connected to the drain electrode of the second thin film transistor T2 and the gate electrode GE of the first thin film transistor T1. The detail shape of the capacitor CST can have various shapes.

The OLED includes a first electrode E1, an emission layer EL, and a second electrode E2. The first electrode E1 is connected to the drain electrode DE of the first thin film transistor T1. The emission layer EL is positioned between the first electrode E1 and the second electrode E2. The second electrode E2 is positioned on the emission layer. At least of the first electrode E1 and the second electrode E2 can be one electrode of a light transmission electrode, a light reflection electrode, and a light translucent electrode, and the light emitted from the emission layer EL can be emitted in at least one electrode direction of the first electrode E1 and the second electrode E2.

The insulating layers IL are positioned between the above-described elements, thereby preventing shorting between the above-described elements. The insulating layers IL can be made of a single layer or a multilayer formed of at least one of the inorganic material and the organic material.

The pixel definition layer PDL includes an opening OA overlapping at least part of the first electrode E1 of the OLED. The pixel definition layer PDL is positioned on the first electrode E1 to cover the end of the first electrode E1. However, the pixel definition layer PDL is not limited thereto, and it can be positioned to be separated from the first electrode E1. The opening OA of the pixel definition layer PDL can define a light emission region of the OLED, and the plane shape of the pixel definition layer PDL opening OA can have a substantially rhombus shape as the shape of the OLED shown in FIG. 1.

In another exemplary embodiment, the plane shape of the opening OA of the pixel definition layer PDL has a polygonal shape such as a triangle, a quadrangle, a pentagon, a hexagon, a heptagon, or an octagon shape, or a circular, an oval, or a closed loop shape.

The encapsulation part EN covers the second electrode E2 of the OLED, and can include a thin film encapsulation layer of a single layer or a multilayer.

In another exemplary embodiment, the encapsulation part EN includes a substrate formed of glass, inorganic material, organic material, metal, and the like.

As described above, in the display device, the stress compensation layer SRL is positioned between adjacent scan lines Sn among the scan lines Sn on the substrate SUB. Although the stress is generated on the substrate SUB as the flexible substrate SUB is bent such that the stress is generated to the insulating layer IL, since the stress generated to the insulating layer IL is dispersed and collected by the stress compensation layer SRL, the insulating layer IL positioned between the adjacent scan lines Sn is suppressed from being damaged by the stress.

For example, although the insulating layer IL includes the inorganic material having brittleness, as the stress compensation layer SRL is positioned between the adjacent scan lines Sn and is positioned on the same layer as the scan line Sn and is formed of the same metal as the scan line Sn, even if the stress is generated to the insulating layer IL as the substrate SUB is bent, since the stress is dispersed and collected by the stress compensation layer SRL, the insulating layer IL formed of the inorganic material is suppressed from being damaged by the stress.

Also, in the display device, as the stress compensation layer SRL includes the material that is different from the material included in the insulating layer IL and having a greater Young's modulus than the material included in the insulating layer IL, although the stress is generated to the insulating layer IL positioned between the adjacent scan lines Sn as the substrate SUB is bent, since the stress compensation layer SRL is elongated by the stress such that the stress is dispersed and collected by the stress compensation layer SRL, the insulating layer IL is suppressed from being damaged by the stress.

That is, by including the stress compensation layer SRL positioned between the adjacent scan lines Sn, the display device in which the part of the insulating layer IL positioned between the adjacent scan lines Sn is suppressed from being damaged by the stress generated as the substrate SUB is bent is provided.

Figure 3:
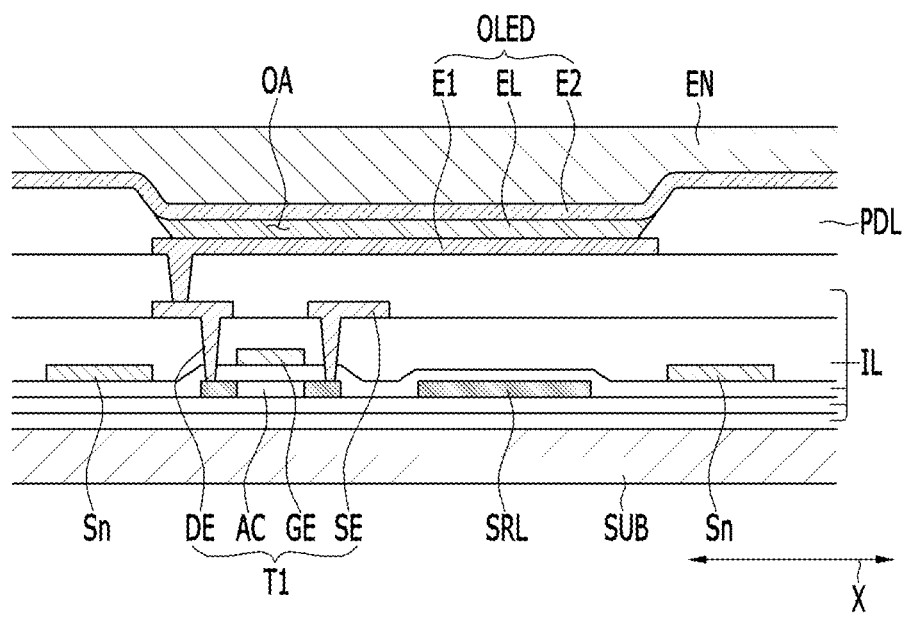
FIG. 3 is a cross-sectional view of a part of a display device according to another exemplary embodiment.

FIG. 3 is a cross-sectional view of a part of a display device according to another exemplary embodiment. Next, parts that are different from those of the display device will be described.

As shown in FIG. 3, the stress compensation layer SRL of the display device is positioned between the substrate SUB and one of the adjacent scan lines Sn. The stress compensation layer SRL is positioned between the substrate SUB and the scan line Sn. The stress compensation layer SRL is positioned on the same layer as the active layer AC of the first thin film transistor T1, and is formed of the same material as the active layer AC, thereby being substantially simultaneously formed with the active layer AC.

In another exemplary embodiment, the stress compensation layer SRL can be positioned on the same layer as the active layer AC, and can be formed of the different material from the active layer AC. In this case, the stress compensation layer SRL can be formed by the different process from the process forming the active layer AC.

As described above, in the display device, the stress compensation layer SRL is positioned between the adjacent scan lines Sn among the scan lines Sn on the substrate SUB and is positioned between the substrate SUB and the scan line Sn. Although the stress is generated on the substrate SUB as the flexible substrate SUB is bent such that the stress is generated to the insulating layer IL, since the stress generated to the insulating layer IL is dispersed and collected by the stress compensation layer SRL, the insulating layer IL positioned between the adjacent scan lines Sn is suppressed from being damaged by the stress.

For example, although the insulating layer IL includes the inorganic material having brittleness, as the stress compensation layer SRL is positioned between the adjacent scan lines Sn and is positioned on the same layer as the active layer AC and is formed of the same material as the active layer AC, even if the stress is generated to the insulating layer IL positioned between the adjacent scan lines Sn as the substrate SUB is bent, since the stress is dispersed and collected by the stress compensation layer SRL, the insulating layer IL including the inorganic material is suppressed from being damaged by the stress.

That is, by including the stress compensation layer SRL positioned between the adjacent scan lines Sn, the display device in which the part of the insulating layer IL positioned between the adjacent scan lines Sn is suppressed from being damaged by the stress generated as the substrate SUB is bent is provided.

Next, a display device will be described with reference to FIG. 4.

Figure 4:
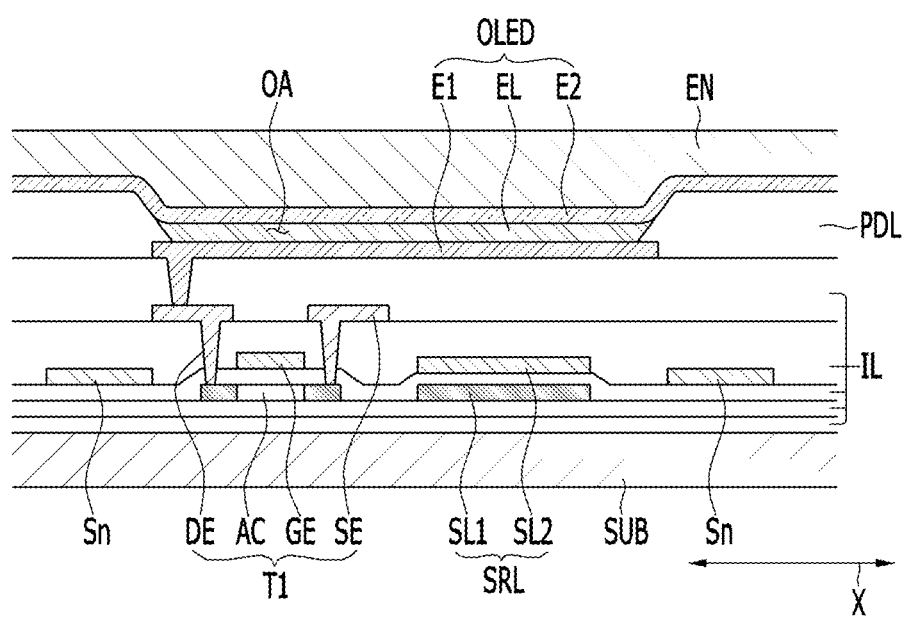
FIG. 4 is a cross-sectional view of a part of a display device according to another exemplary embodiment.

FIG. 4 is a cross-sectional view of a part of a display device according to another exemplary embodiment.

Next, parts that are different from those of the display devices will be described.

As shown in FIG. 4, the stress compensation layer SRL of the display device includes a first sublayer SL1 and a second sublayer SL2.

The first sublayer SL1 is positioned on the substrate SUB, and is positioned between the substrate SUB and the scan line Sn. The first sublayer SL1 is positioned on the same layer as the active layer AC of the first thin film transistor T1, and is formed of the same material as the active layer AC, thereby being substantially simultaneously formed with the active layer AC.

In another exemplary embodiment, the first sublayer SL1 can be positioned on the same layer as the active layer AC and can formed of the different material from the active layer AC. In this case, the first sublayer SL1 can be formed by the different process from the process forming the active layer AC.

The second sublayer SL2 is positioned on the first sublayer SL1. The second sublayer SL2 is positioned on the same layer as the adjacent scan lines Sn, and is formed of the same material as the adjacent scan lines Sn. The second sublayer SL2 is positioned on the same layer as the scan lines Sn and is formed of the same material, thereby being substantially simultaneously formed with the scan lines Sn. As the second sublayer SL2 is positioned on the same layer as the scan lines Sn, the second sublayer SL2 is positioned on the same layer as gate electrode GE of the first thin film transistor T1 positioned on the same layer as the scan lines Sn.

In another exemplary embodiment, the second sublayer SL2 can be positioned on the same layer as the scan lines Sn and can be formed of the different material from the scan lines Sn. In this case, the second sublayer SL2 can be formed by the different process from the process forming the scan lines Sn.

That is, the stress compensation layer SRL including the first sublayer SL1 and the second sublayer SL2 can be made of the multilayer.

As described above, in the display device, the stress compensation layer SRL is positioned between the adjacent scan lines Sn among the scan lines Sn on the substrate SUB and includes the first sublayer SL1 positioned between the substrate SUB and the scan line Sn and the second sublayer SL2 positioned on the first sublayer SL1 and positioned on the same layer as the scan lines Sn. Although the stress is generated on the substrate SUB as the flexible substrate SUB is bent such that the stress is generated to the insulating layer IL positioned between the adjacent scan lines Sn, since the stress generated to the insulating layer IL is dispersed and collected by the first sublayer SL1 and the second sublayer SL2 of the stress compensation layer SRL, the insulating layer IL positioned between the adjacent scan lines Sn is suppressed from being damaged by the stress.

Figure 5:
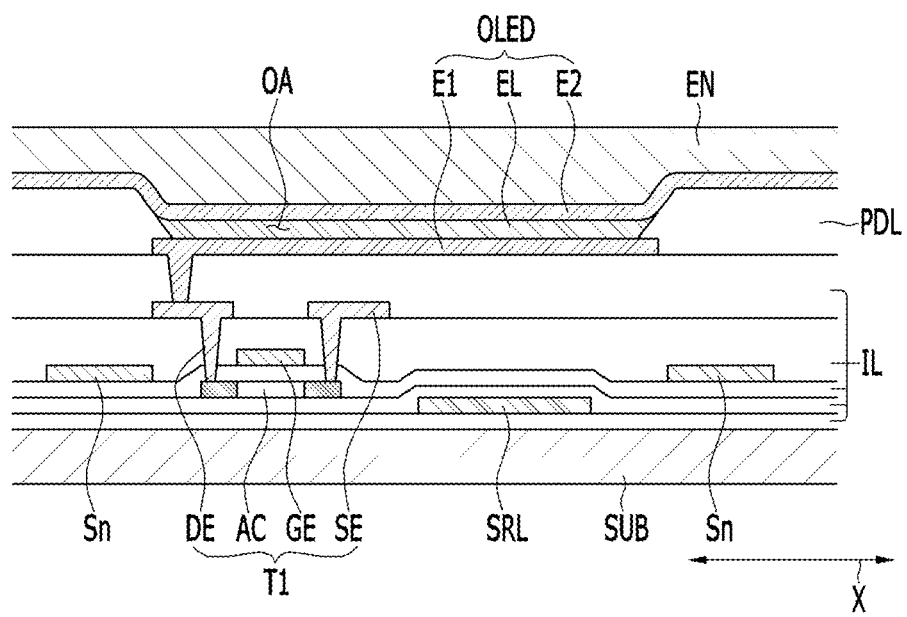
FIG. 5 is a cross-sectional view of a part of a display device according to another exemplary embodiment.

FIG. 5 is a cross-sectional view of a part of a display device according to another exemplary embodiment. Next, parts that are different from those of the display devices will be described.

As shown in FIG. 5, the stress compensation layer SRL of the display device is positioned between the substrate SUB and one of the adjacent scan lines Sn. The stress compensation layer SRL is positioned between the substrate SUB and the scan line Sn. The stress compensation layer SRL is positioned between the active layer AC of the first thin film transistor T1 and the substrate SUB.

As described above, in the display device, the stress compensation layer SRL is positioned between the adjacent scan lines Sn among the scan lines Sn on the substrate SUB and is positioned between the substrate SUB and the active layer AC. Although the stress is generated on the substrate SUB as the flexible substrate SUB is bent such that the stress is generated to the insulating layer IL positioned between the adjacent scan lines Sn, since the stress generated to the insulating layer IL is dispersed and collected by the stress compensation layer SRL, the insulating layer IL positioned between the adjacent scan lines Sn is suppressed from being damaged by the stress.

Figure 6:
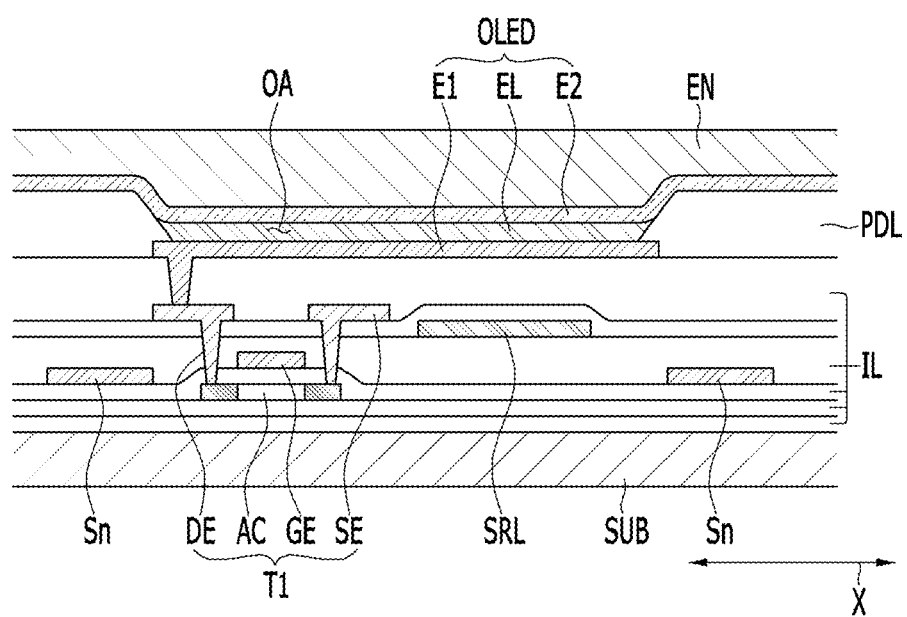
FIG. 6 is a cross-sectional view of a part of a display device according to another exemplary embodiment.

FIG. 6 is a cross-sectional view of a part of a display device according to another exemplary embodiment. Next, parts that are different from those of the display devices will be described.

As shown in FIG. 6, the stress compensation layer SRL of the display device is positioned on the adjacent scan lines Sn. The stress compensation layer SRL is positioned between the scan line Sn and the first electrode E1 of the OLED. The stress compensation layer SRL can be formed of the same material as the scan line Sn or the data line Dn. However, it is not limited thereto, and it can be formed of at least one among the organic material, the metal, and the inorganic material.

As described above, in the display device, the stress compensation layer SRL is positioned between the adjacent scan lines Sn among the scan lines Sn and is positioned on the adjacent scan lines Sn. Although the stress is generated on the substrate SUB as the flexible substrate SUB is bent such that the stress is generated to the insulating layer IL positioned between the adjacent scan lines Sn, since the stress generated to the insulating layer IL is dispersed and collected by the stress compensation layer SRL, the insulating layer IL positioned between the adjacent scan lines Sn is suppressed from being damaged by the stress.

Figure 7:
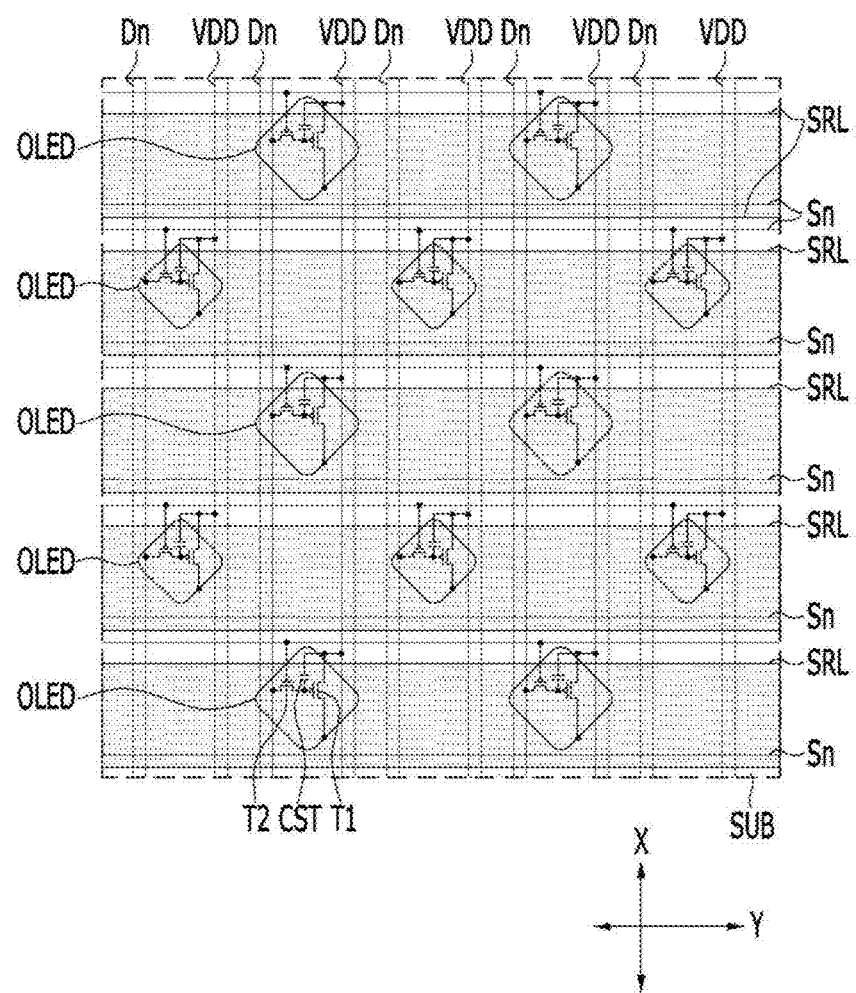
FIG. 7 is a cross-sectional view of a part of a display device according to another exemplary embodiment.

FIG. 7 is a cross-sectional view of a part of a display device according to another exemplary embodiment. Next, parts that are different from those of the display devices will be described.

As shown in FIG. 7, the stress compensation layer SRL of the display device overlaps at least one of the adjacent scan lines Sn between the adjacent scan lines Sn. In FIG. 7, the stress compensation layer SRL overlaps one of the adjacent scan lines Sn. However, it is not limited thereto, and the stress compensation layer SRL can overlap all of the adjacent scan lines Sn.

The stress compensation layer SRL is not positioned on the same layer as the adjacent scan lines Sn, and it can be positioned on the scan lines Sn or under the scan lines Sn.

As described above, in the display device, the stress compensation layer SRL overlaps at least one of the adjacent the scan lines Sn between the adjacent scan lines Sn among the scan lines Sn. Although the stress is generated on the substrate SUB as the flexible substrate SUB is bent such that the stress is generated to the insulating layer IL positioned between the adjacent scan lines Sn, since the stress generated to the insulating layer IL is dispersed and collected by the stress compensation layer SRL, the insulating layer IL positioned between the adjacent scan lines Sn is suppressed from being damaged by the stress.

Figure 8:
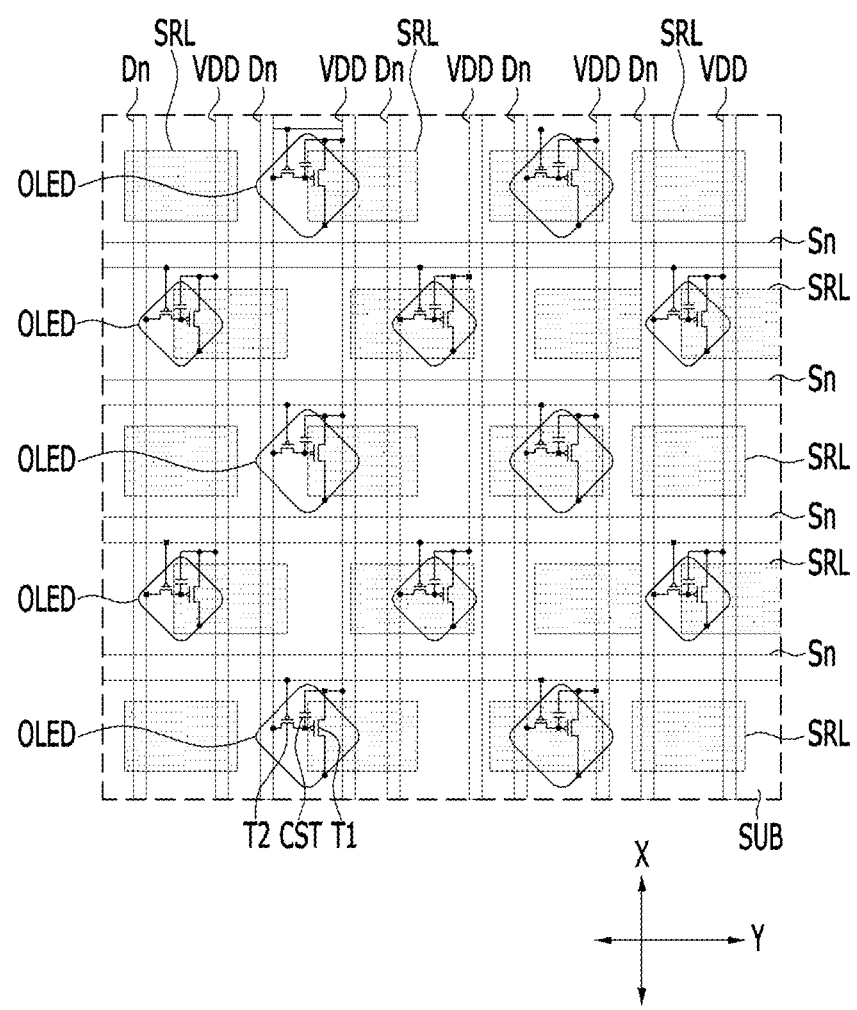
FIG. 8 is a cross-sectional view of a part of a display device according to another exemplary embodiment.

FIG. 8 is a cross-sectional view of a part of a display device. Next, parts that are different from those of the display devices will be described.

As shown in FIG. 8, the stress compensation layer SRL of the display device is positioned between the adjacent scan lines Sn. The stress compensation layer SRL has an island shape on a plane. The stress compensation layer SRL of the island shape is plural, and each of the stress compensation layers SRL can be dispersed in formal shape or informal shape. The stress compensation layer SRL can be positioned on the same layer as the adjacent scan lines Sn, on the scan lines Sn, or under the scan lines Sn.

In FIG. 8, the stress compensation layer SRL has a quadrangle shape in the plane. However it is not limited thereto, and the stress compensation layer SRL can have a polygonal shape such as a triangle, a pentagon, a hexagon, a heptagon, or an octagon shape, or a circular, an oval, a linear, a non-linear, or a closed loop shape in the plane.

As described above, in the display device, the stress compensation layer SRL is positioned with the island shape between the adjacent scan lines Sn among the scan lines Sn. Although the stress is generated on the substrate SUB as the flexible substrate SUB is bent such that the stress is generated to the insulating layer IL positioned between the adjacent scan lines Sn, since the stress generated to the insulating layer IL is dispersed and collected by the stress compensation layer SRL of the island shape, the insulating layer positioned between the adjacent scan lines Sn is suppressed from being damaged by the stress.

Also, in the display device, as the stress compensation layer SRL has the island shape, other configurations adjacent to the stress compensation layer SRL are suppressed from being interfered with. Accordingly, although the region where the stress compensation layer SRL can be positioned is limited, the compensation layer SRL of the island shape can be disposed in the limited region. For example, although the pixel circuit including the thin film transistors connected to the OLED and at least one capacitor has the disclosed complicated structure such that the region where the stress compensation layer SRL can be positioned is limited, since the stress compensation layer SRL has the island shape in the plane, the stress compensation layer SRL of the island shape can be disposed in the limited region.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a substrate;
    a plurality of scan lines on the substrate and separated from each other in a first direction, wherein the scan lines extend in a second direction crossing the first direction;
    a stress compensation layer positioned between adjacent ones of the scan lines; and an insulating layer covering the stress compensation layer, wherein the stress compensation layer comprises a different material from that of the insulating layer.

2. The display device of claim 1, wherein the stress compensation layer is configured to electrically float.

3. The display device of claim 1, wherein the stress compensation layer overlaps at least one of the adjacent scan lines in the depth dimension of the display device.

4. The display device of claim 1, wherein the stress compensation layer does not overlap the adjacent scan lines in the depth dimension of the display device.

5. The display device of claim 1, wherein the stress compensation layer is positioned between the substrate and one of the adjacent scan lines.

6. The display device of claim 1, further comprising another insulating layer that covers the scan lines, wherein the stress compensation layer is positioned on the other insulating layer.

7. The display device of claim 1, wherein the stress compensation layer is positioned on the same layer as the adjacent scan lines.

8. The display device of claim 1, wherein the stress compensation layer includes:
a first sublayer positioned over the substrate; and
a second sublayer positioned over the first sublayer.

9. The display device of claim 1, further comprising:
a plurality of transistors electrically connected to at least one of the scan lines; and
a plurality of organic light-emitting diodes (OLEDs) electrically connected to the transistors.

10. The display device of claim 9, wherein each of the transistors includes:
an active layer positioned over the substrate; and
a gate electrode positioned over the active layer.

11. The display device of claim 10, wherein the stress compensation layer is positioned on the same layer as the active layer.

12. The display device of claim 10, wherein the stress compensation layer is positioned on the same layer as the gate electrode.

13. The display device of claim 9, further comprising a plurality of data lines crossing the scan lines and electrically connected to at least one of the transistors.

14. The display device of claim 13, wherein the stress compensation layer crosses the data lines.

15. The display device of claim 1, wherein the stress compensation layer extends in the second direction.

16. The display device of claim 1, wherein the stress compensation layer has a line shape.

17. The display device of claim 1, wherein the stress compensation layer has an island shape.

18. The display device of claim 1, wherein the substrate is flexible.

19. The display device of claim 1, wherein the stress compensation layer has a Young's modulus greater than that of the insulating layer.

\* \* \* \* \*